US012615726B2

(12) United States Patent
Wang

(10) Patent No.: US 12,615,726 B2
(45) Date of Patent: Apr. 28, 2026

(54) BOX BODY, HIGH-VOLTAGE BOX APPARATUS, ENERGY STORAGE DEVICE, AND ELECTRIC EQUIPMENT

(71) Applicant: NINGDE AMPEREX TECHNOLOGY LIMITED, Ningde City (CN)

(72) Inventor: Lu Wang, Dongguan City (CN)

(73) Assignee: NINGDE AMPEREX TECHNOLOGY LIMITED, Ningde City (CN)

( * ) Notice: Subject to any disclaimer, the term of this patent is extended or adjusted under 35 U.S.C. 154(b) by 285 days.

(21) Appl. No.: 18/374,766

(22) Filed: Sep. 29, 2023

(65) Prior Publication Data

US 2024/0023258 A1     Jan. 18, 2024

Related U.S. Application Data

(63) Continuation of application No. PCT/CN2021/118561, filed on Sep. 15, 2021.

(30) Foreign Application Priority Data

Mar. 31, 2021     (CN) .......................... 202110350174.0

(51) Int. Cl.
*H05K 5/02*          (2006.01)
*H05K 5/00*          (2006.01)
*H05K 5/10*          (2025.01)
(52) U.S. Cl.
CPC ......... *H05K 5/0217* (2013.01); *H05K 5/0026* (2013.01); *H05K 5/10* (2025.01)

(58) Field of Classification Search
CPC .. H05K 5/0217; H05K 5/0026; H05K 7/1421; H05K 7/1422; H01M 50/244
See application file for complete search history.

(56) References Cited

U.S. PATENT DOCUMENTS

| | | | |
|---|---|---|---|
| 4,153,127 | A | 5/1979 | Klink et al. |
| 2003/0090869 | A1 | 5/2003 | Liu et al. |

(Continued)

FOREIGN PATENT DOCUMENTS

| | | |
|---|---|---|
| CN | 102849039 A | 1/2013 |
| CN | 202841794 U | 3/2013 |

(Continued)

OTHER PUBLICATIONS

Machine translation of KR102053033 (Year: 2025).*

(Continued)

*Primary Examiner* — Sagar Shrestha
(74) *Attorney, Agent, or Firm* — WHDA, LLP

(57)          ABSTRACT

A box body a high-voltage box apparatus, an energy storage device, and electric equipment. The high-voltage box apparatus includes a functional module and the box body is configured to the functional module is installed. The box body includes a housing, a support, and a tray assembly. The support is disposed inside the housing, and the tray assembly is movably disposed on the support. The housing is provided with a first opening thereon, and the tray assembly is movable between a first position and a second position relative to the support, the tray assembly is at least partially movable out of the housing through the first opening. The tray assembly is configured for fixing the functional module.

16 Claims, 13 Drawing Sheets

(56) References Cited

U.S. PATENT DOCUMENTS

| | | | | |
|---|---|---|---|---|
| 2009/0016037 | A1 | 1/2009 | Chen et al. | |
| 2015/0208543 | A1* | 7/2015 | Chen | H05K 7/1489 |
| | | | | 361/679.39 |
| 2016/0041590 | A1* | 2/2016 | Yu | G06F 1/1626 |
| | | | | 361/679.32 |
| 2016/0165742 | A1* | 6/2016 | Shen | G06F 1/187 |
| | | | | 361/679.37 |
| 2018/0352679 | A1 | 12/2018 | Monson et al. | |

FOREIGN PATENT DOCUMENTS

| | | | | | |
|---|---|---|---|---|---|
| CN | 203805822 | U | 9/2014 | | |
| CN | 206797307 | U | 12/2017 | | |
| CN | 110654405 | A | 1/2020 | | |
| CN | 210807850 | U | 6/2020 | | |
| CN | 212258492 | U | 12/2020 | | |
| CN | 212518547 | U | 2/2021 | | |
| CN | 112918260 | A | 6/2021 | | |
| CN | 214775393 | U | 11/2021 | | |
| EP | 1186266 | A1 | 3/2002 | | |
| JP | 2009-165746 | A | 7/2009 | | |
| KR | 102053033 | B1 * | 12/2019 | ......... | H01M 10/488 |
| TW | M550012 | U | 10/2017 | | |

OTHER PUBLICATIONS

International Search Report dated Oct. 29, 2021, issued in counterpart International Application No. PCT/CN2021/118561, w/English translation (7 pages).

Extended (Supplementary) European Search Report dated Sep. 23, 2024, issued in counterpart EP Application No. 21934429.8. (5 pages).

Office Action dated Nov. 29, 2024, issued in counterpart CN Application No. 202110350174.0. (9 pages).

Office Action dated Jul. 16, 2025, issued in counterpart CN Application No. 202110350174.0. (8 pages).

* cited by examiner

BOX BODY, HIGH-VOLTAGE BOX APPARATUS, ENERGY STORAGE DEVICE, AND ELECTRIC EQUIPMENT

CROSS-REFERENCE TO RELATED APPLICATIONS

This application is a continuation application of International Application No. PCT/CN2021/118561, filed on Sep. 15, 2021, which claims the benefit of priority of Chinese patent application 202110350174.0, filed on Mar. 31, 2021, the contents of which incorporated herein by reference in its entirety.

TECHNICAL FIELD

This application relates to the technical field of energy storage devices, and in particular, to a box body, a high-voltage box apparatus, an energy storage device, and electric equipment.

BACKGROUND

In recent years, with the development of new energy source technologies, batteries, as efficient and clean energy sources with high cyclic utilization rate, have become more and more widely applied. A high-voltage box fora battery is a control unit that distributes battery energy, and is one of the key components of an electric vehicle. The high-voltage box is internally provided with a battery management system, power supply control, insulation detection, and other functional modules. When the functional modules fail, the high-voltage box needs to be disassembled and then replaced, which makes the installation and maintenance more complicated.

SUMMARY

This application provides a box body, a high-voltage box apparatus, an energy storage device, and electric equipment, which may facilitate the installation and maintenance of a functional module.

Some embodiments of this application use the following technical solutions to solve the technical problem thereof:

In a first aspect, one embodiment of this application provides a box body, including a housing, a support, and a tray assembly, wherein the support is disposed inside the housing, and the tray assembly is movably disposed on the support. The housing is provided with a first opening thereon, and the tray assembly is movable relative to the support, so that the tray assembly is at least partially movable out of the housing through the first opening. The tray assembly is used for fixing a functional module to drive the functional assembly to move between the inside and outside of the housing, so as to facilitate the installation and maintenance of the functional module.

In some embodiments, the support is provided with a slideway thereon, the tray assembly is disposed inside the slideway, and the tray assembly is movable relative to the support along the slideway. The slideway is used for limiting and guiding the support.

In some embodiments, the slideway includes a first slideway and a second slideway which are respectively disposed on two opposite sides of the support. The tray assembly includes a first tray and a second tray. The first tray is disposed in the first slideway, and the second tray is disposed in the second slideway. The first tray and the second tray may be respectively installed with different functional modules, so that different functional modules can separately move out of the housing for installation and maintenance.

In some embodiments, the first slideway is arranged along a first direction, and the first tray is movable inside the first slideway along the first direction, so that the first tray is limited relative to the support in second and third directions. The second slideway is arranged along the first direction, and the second tray is movable inside the second slideway along the first direction, so that the second tray is limited relative to the support in the second and third directions. The first direction, the second direction, and the third direction are perpendicular to each other.

In some embodiments, the housing includes a bottom plate on which the support is disposed. The support includes a main body portion, a first slideway portion, and a second slideway portion. The first slideway portion is disposed on a side of the main body portion facing the bottom plate, and the second slideway portion is disposed on one side of the main body portion facing away from the bottom plate. The first slideway portion and the bottom plate form the first slideway, and the second slideway portion and the main body portion form the second slideway.

In some embodiments, the housing further includes a first side plate disposed on one side of the bottom plate along the first direction. When the first tray moves to a first position, the first tray is connected with the first side plate. When the second tray moves to the first position, the second tray is connected with the first side plate. The first side plate may respectively limit the first tray and the second tray along the first direction.

In some embodiments, the first tray includes a first tray portion and a first extending portion. The first tray portion is connected to the first extending portion. The first tray portion is used for fixing the functional module and the first extending portion is configured to be connected with the first slideway portion.

In some embodiments, the first slideway portion includes a first section and a second section. The first section extends from the main body portion in a direction away from the bottom plate, and the second section extends from the first section along the second direction. The first extending portion includes a first extending section and a second extending section. The first extending section extends from the first tray portion in the direction facing away from the bottom plate, and the second extending section extends from the first extending section along the second direction. The first section is configured to limit the movement of the first extending section along the second direction, and the second section is configured to limit the movement of the second extending section along the third direction. The first direction, the second direction, and the third direction are respectively perpendicular to each other.

In some embodiments, a gap is provided between the first section and the first extending section along the second direction to reduce the friction force between the first section and the first extending section, thereby facilitating the movement of the first tray.

In some embodiments, a gap is provided between the second section and the second extending section along the second direction to reduce the friction force between the second section and the second extending section, thereby facilitating the movement of the first tray.

In some embodiments, the main body portion includes a supporting portion and a connecting portion, and the second slideway portion is disposed on the supporting portion.

In some embodiments, the connecting portion includes a first connecting section and a second connecting section. The first connecting section is connected between the supporting portion and the second connecting section, the first connecting section extends from one side of the supporting portion in a direction of the bottom plate, and the second connecting section extends from the first connecting section along the second direction.

In some embodiments, along the second direction, the second connecting section and the second section are respectively disposed on two opposite sides of the first section, and the first connecting section, the second connecting section, and the first section form a receiving groove.

In some embodiments, the box body includes a fastener which fixes the second connecting section and the bottom plate, and is at least partially disposed in the receiving groove.

In a second aspect, another embodiment of the present application further provides a high-voltage box apparatus, including a functional module and the box body of any one of the foregoing, wherein the functional module is installed on the tray assembly.

In some embodiment, the functional module includes a first circuit board and a second circuit board. The first circuit board is provided with a first connecting member, and the second circuit board is provided with a second connecting member. The high-voltage box apparatus includes a fourth circuit board provided with a fourth connecting member. The first connecting member is in plug-in connection with the fourth connecting member to realize the connection between the first circuit board and the fourth circuit board, and the second connecting member is in plug-in connection with the fourth connecting member to realize the connection between the second circuit board and the fourth circuit board.

In some embodiments, the functional module includes at least one of a management system main board, a power supply main body, or an insulation detection board.

In a third aspect, another embodiment of the present application further provides an energy storage device, including the high-voltage box apparatus of any one of the foregoing.

In a fourth aspect, another embodiment of the present application further provides electric equipment, including the high-voltage box apparatus of any one of the foregoing.

Compared to the prior art, in some embodiments of the present application, the housing is provided with the first opening thereon, the support is disposed inside the housing, the tray assembly is movably disposed on the support, the tray assembly is movable relative to the support, the functional module may be installed on the tray assembly, and the tray assembly may drive the functional assembly to move from the inside of the housing to the outside of the housing, so as to facilitate the installation and maintenance of the functional module.

BRIEF DESCRIPTION OF DRAWINGS

One or more embodiments are exemplarily illustrated by means of pictures in the accompanying drawings corresponding thereto. These exemplary illustrations do not constitute a limitation on some embodiments. Elements with the same reference numerals in the accompanying drawings denote similar elements. Unless specifically stated, the figures in the accompanying drawings do not constitute a scale limitation.

4

Figure 1:
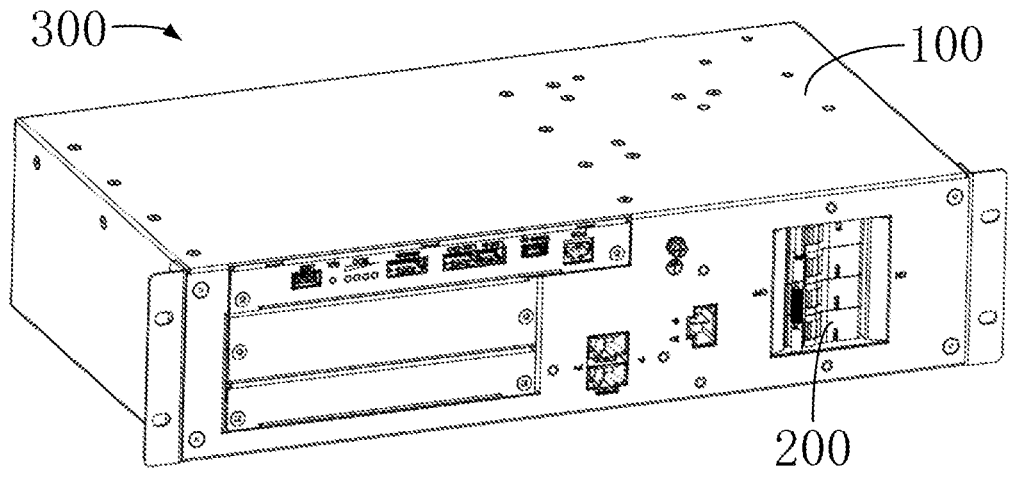
Figure 2:
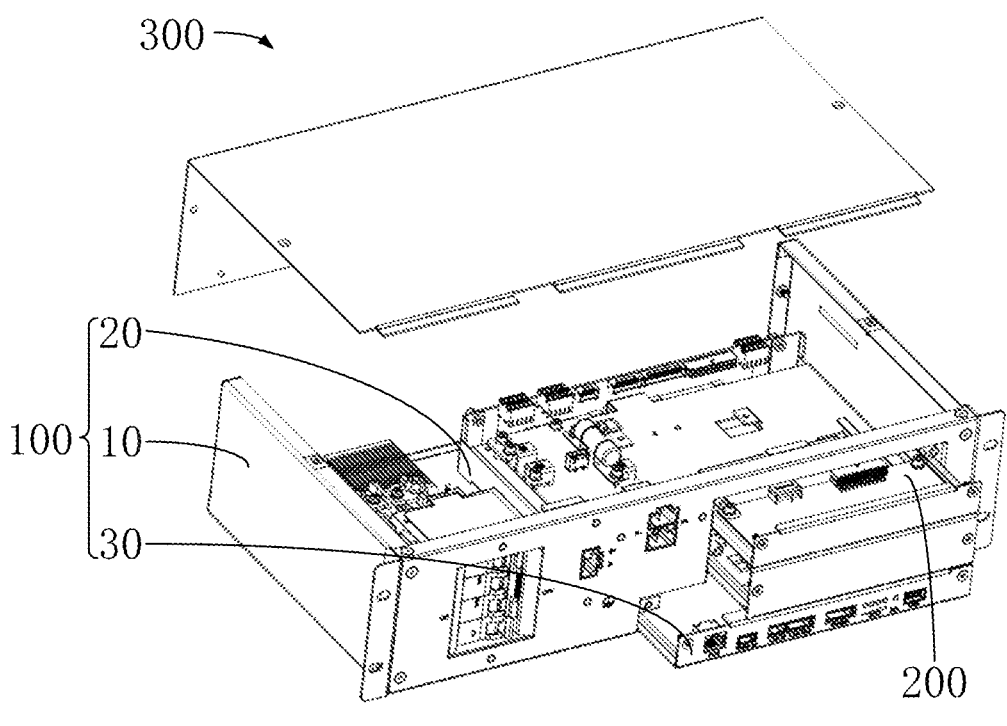
Figure 3:
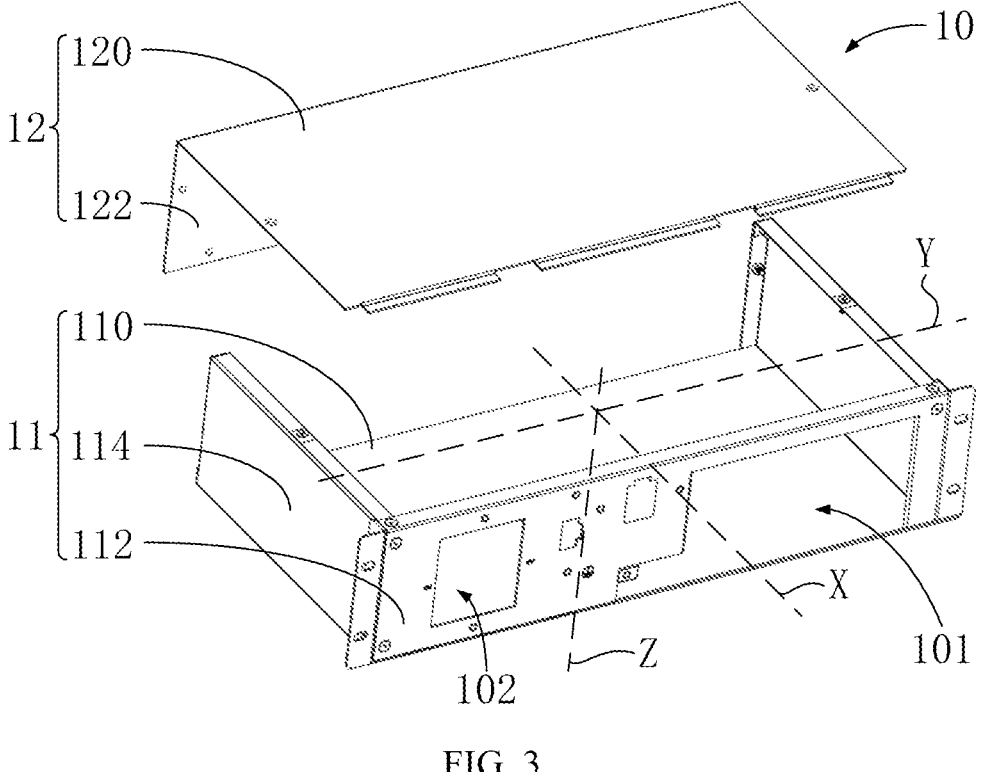
Figure 4:
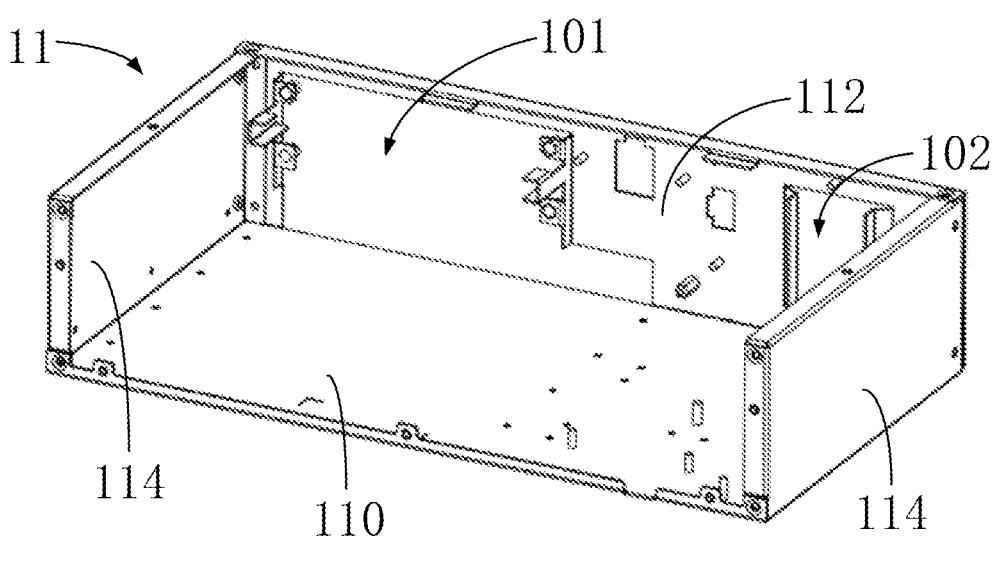
Figure 5:
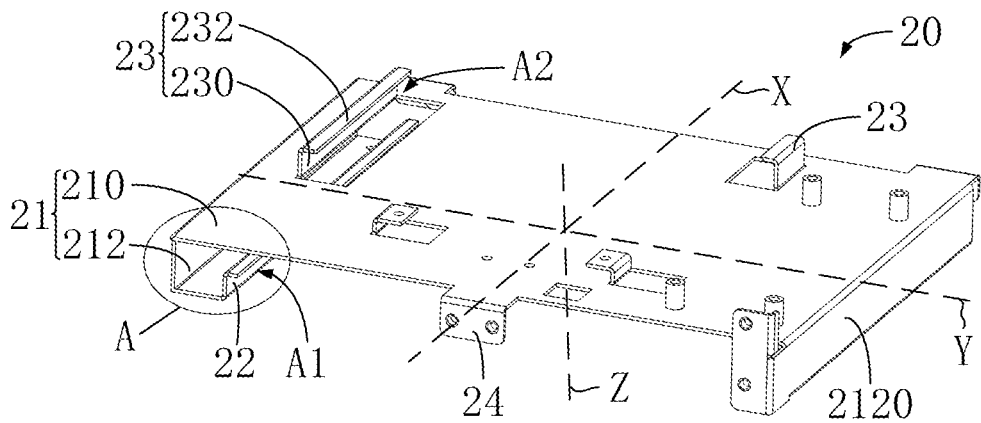
Figure 6:
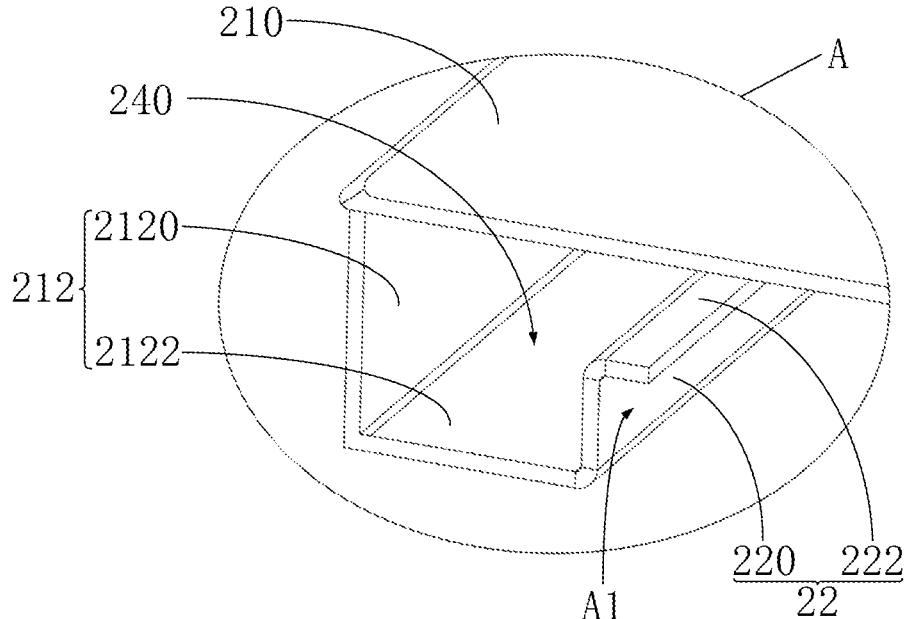
Figure 7:
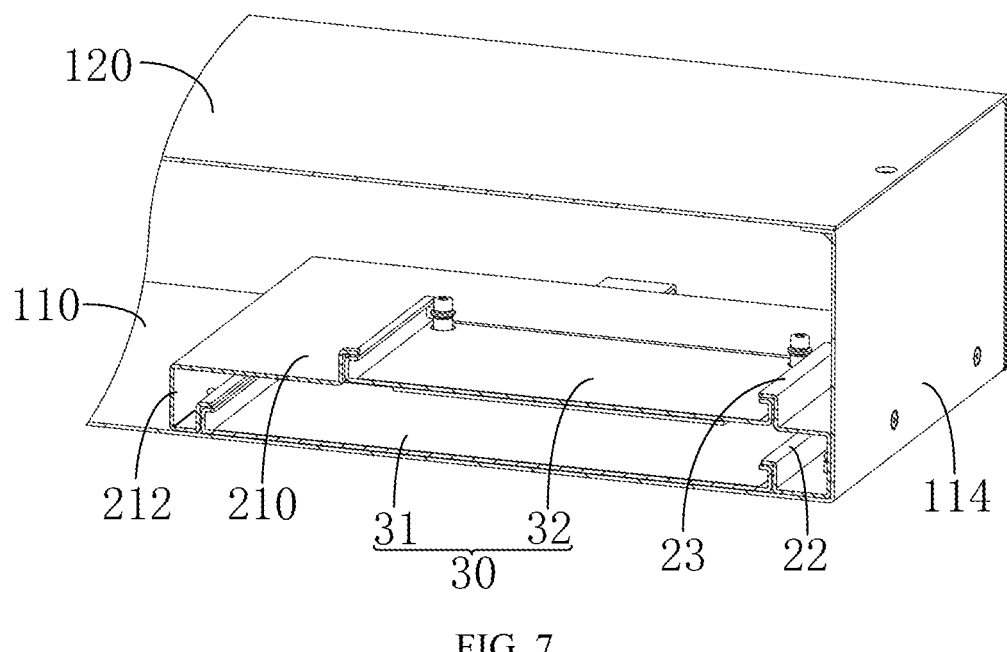
Figure 8:
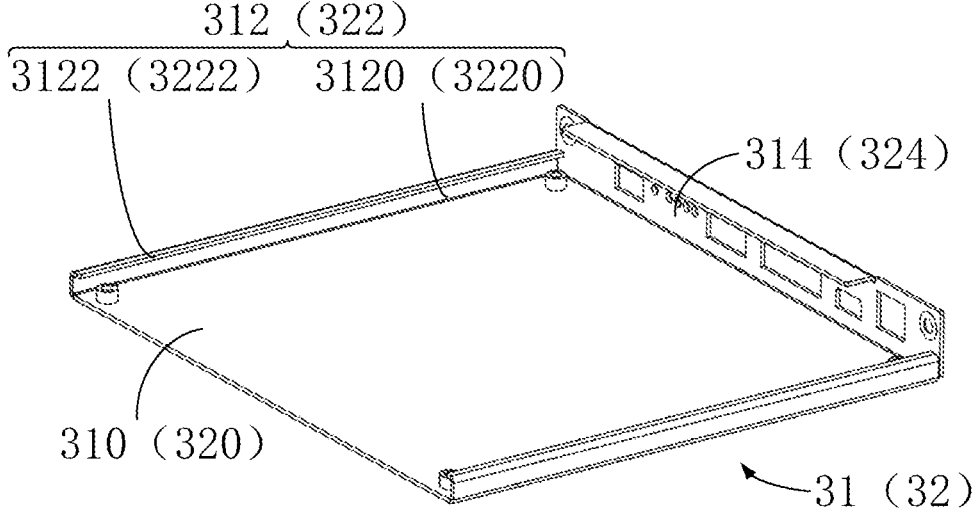
Figure 9:
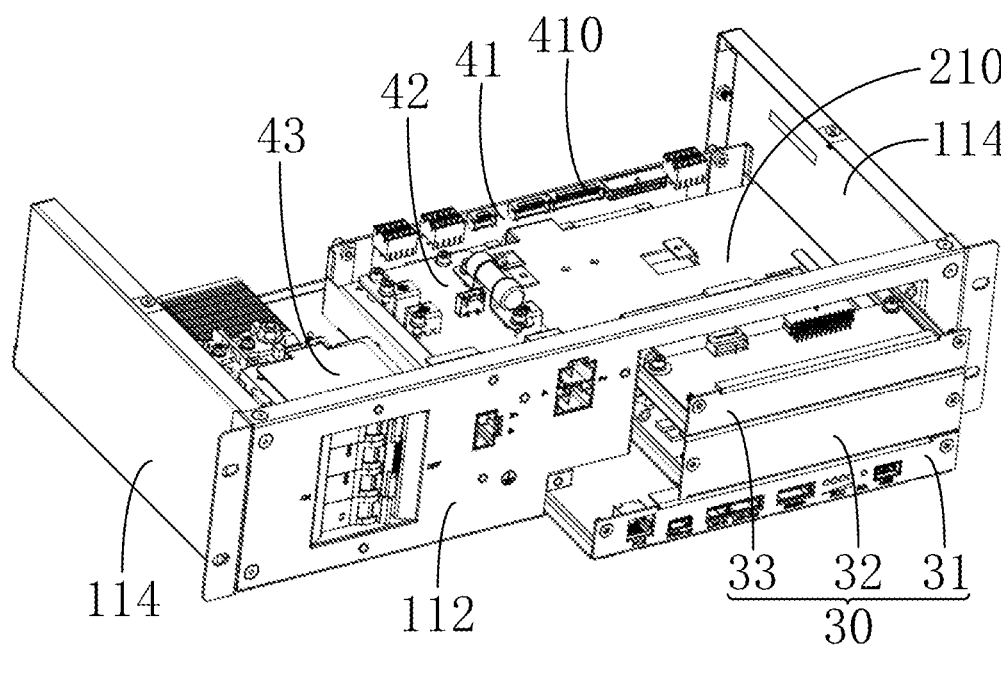
Figure 10:
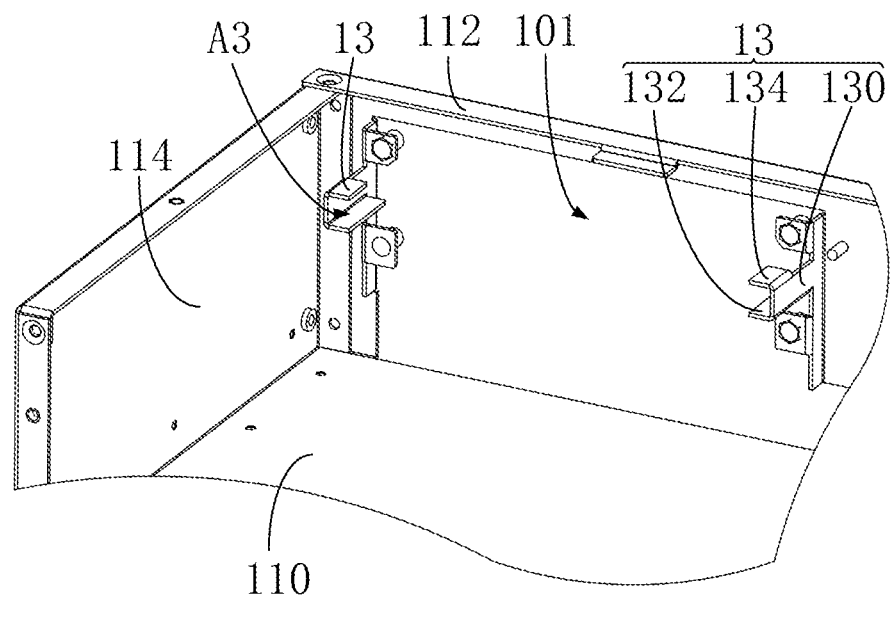
Figure 11:
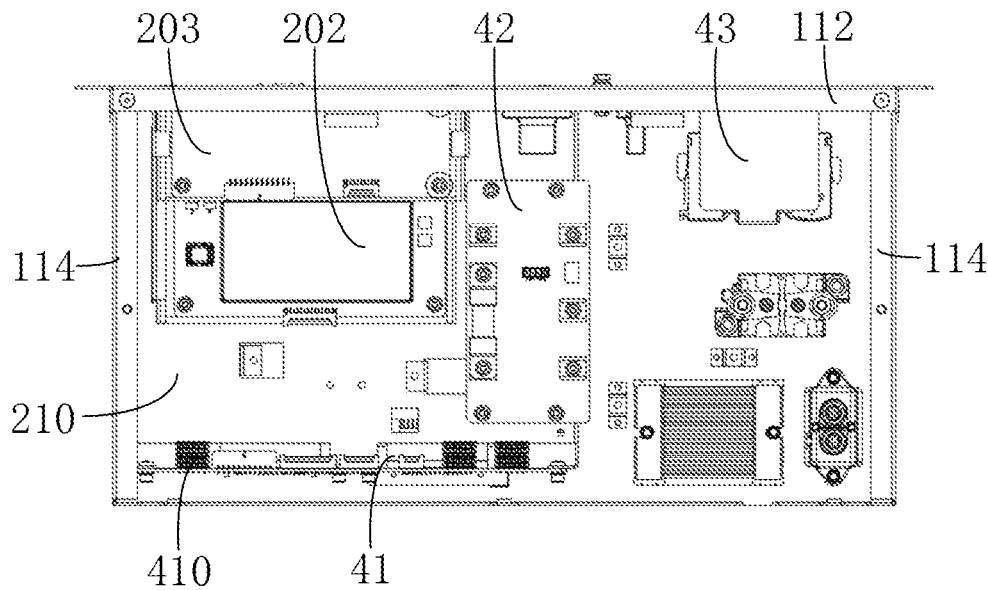
Figure 12:
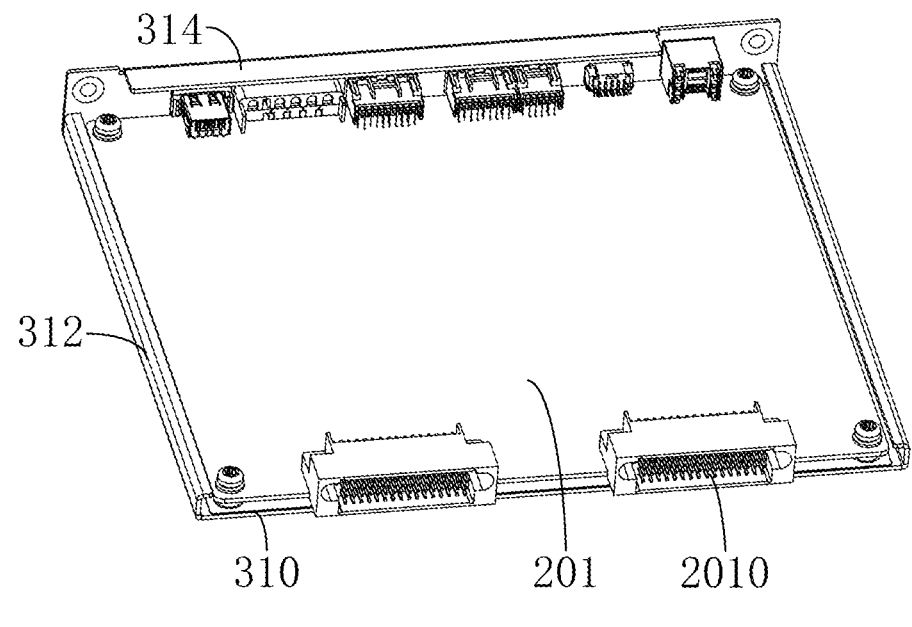
Figure 13:
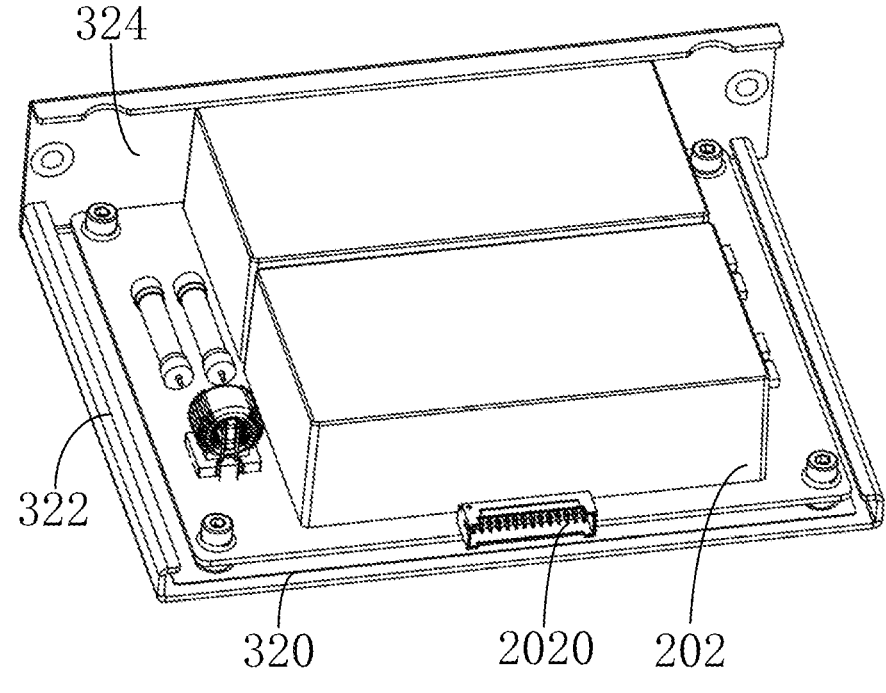

FIG. 1 is a structural schematic drawing of a high-voltage box apparatus provided by one embodiment of the present application;

FIG. 2 is an exploded schematic drawing of the high-voltage box apparatus shown in FIG. 1;

FIG. 3 is a structural schematic drawing of a housing of the high-voltage box apparatus shown in FIG. 1;

FIG. 4 is a structural schematic drawing of a lower shell of the housing shown in FIG. 3;

FIG. 5 is a structural schematic drawing of a support of the high-voltage box apparatus shown in FIG. 1;

FIG. 6 is an enlarged drawing of the support shown in FIG. 5 at A;

FIG. 7 is a structural schematic drawing of the housing and a tray assembly of the high-voltage box apparatus shown in FIG. 1, with some elements omitted;

FIG. 8 is a structural schematic drawing of a first tray and a second tray of the tray assembly shown in FIG. 7;

FIG. 9 is a structural schematic drawing of a high-voltage box apparatus provided by another embodiment of the present application;

FIG. 10 is a structural schematic drawing of a housing of the high-voltage box apparatus shown in FIG. 9, with some elements omitted;

FIG. 11 is a structural schematic drawing of the high-voltage box apparatus shown in FIG. 9 from another angle of view;

FIG. 12 is a structural schematic drawing of a first tray and a first circuit board of the high-voltage box apparatus shown in FIG. 9; and FIG. 13 is a structural schematic drawing of a second tray and a second circuit board of the high-voltage box apparatus shown in FIG. 9.

DETAILED DESCRIPTION

In order to facilitate the understanding of this application, this application will be described in more detail below in conjunction with the accompanying drawings and specific implementations. It should be noted that when an element is expressed to be "fixed" to another element, it may be directly on the other element, or there may be one or more centered elements therebetween. When an element is expressed to be "connected" to another element, it may be directly connected to the other element, or there may be one or more centered elements therebetween. The terms "up", "down", "left", "right", "inside", "outside", and similar expressions used in this specification are or the purpose of illustration only.

Unless otherwise defined, all technical and scientific: terms used in this specification have the same meaning as commonly understood by one of ordinary skill in the art to which this application belongs. In this specification, the terms used in the specification of this application are for the purpose of describing specific implementations only, and are not used to limit this application. The terms "and/or" used in this specification includes any or all combinations of one or more associated listed items.

Referring to FIGS. 1-3 together, one embodiment of this application provides a high-voltage box apparatus 300, including a box body 100 and a functional module 200 installed in the box body 100. The box body 100 includes a housing 10, a support 20, and a tray assembly 30. The support 20 is disposed inside the housing 10, and the tray assembly 30 is movably disposed on the support 20. The housing 10 is provided with a first opening 101 thereon, and the tray assembly 30 is movable between a first position and a second position relative to the support 20, so that the tray assembly 30 is at least partially movable out of the housing 10 through the first opening 101. The tray is used for fixing the functional module.

Referring to FIGS. 2-4 together, the housing 10 includes a lower shell 11 and an upper cover 12. The lower shell 11 and the upper cover 12 are connected and enclosed to form a receiving space in which the support 20 is arranged. The lower shell 11 includes a bottom plate 110, a first side plate 112, and two second side plates 114. The first side plate 112 and the two second side plates 114 are respectively disposed on the bottom plate 110. The first side plate 112 is disposed on one side of the bottom plate 110 along a first direction X, the two second side plates 114 are respectively disposed on both sides of the bottom plate 110 along a second direction Y, and the first side plate 112 is respectively connected with the two second side plates 114. The upper cover 12 includes a top plate 120 and a third side plate 122. The top plate 120 is spaced apart from the bottom plate 110 along a third direction Z, and the top plate 120 is respectively connected to the first side plate 112 and the sides of the second side plates 114 facing away from the bottom plate 110. The third side plate 122 extends from the top plate 120 along the third direction Z to abut against the bottom plate 110. The third plate 122 is further connected with the sides of the two second side plates 114 facing away from the first side plate 112, respectively. The first side plate 112 is provided with a first opening 101 thereon, so that the receiving space communicates with the outside. The first direction X, the second direction Y and the third direction Z are respectively perpendicular to each other.

Referring to FIGS. 4-6 together, the support 20 is arranged on the bottom plate 110 of the housing 10, and the position of the support 20 corresponds to that of the first opening 101. The support 20 includes a main body portion 21, a first slideway portion 22, and a second slideway portion 23. The first slideway portion 22 and the second slideway portion 23 respectively extend along the first direction X, and the first slideway portion 22 and the second slideway portion 23 are respectively arranged on two sides of the main body portion 21 along the third direction Z. The first slideway portion 22 is disposed on one side of the main body portion 21 facing the bottom plate 110, and the first slideway portion 22 and the bottom plate 110 form a first slideway A1. The second slideway portion 23 is disposed on one side of the main body portion 21 facing away from the bottom plate 110, and the second slideway portion 23 and the main body portion 21 form a second slideway A2.

The main body portion 21 includes a supporting portion 210 and a connecting portion 212, the connecting portion 212 is disposed on one side of the supporting portion 210 facing the bottom plate 110. Preferably, the supporting portion 210 is arranged parallel to the bottom plate 110. The second slideway portion 23 is disposed on the supporting portion 210. The connecting portion 212 includes a first connecting section 2120 and a second connecting section 2122. The first connecting section 2120 is connected between the supporting portion 210 and the second connecting section 2122. The first connecting section 2120 extends from one side of the supporting portion 210 in a direction of the bottom plate 110, and the second connecting section 2122 extends from the first connecting section 2120 along the second direction Y. Preferably, the second connecting section 2122 is arranged parallel to the bottom plate 110. The second connecting section 2122 is connected to the bottom plate 110. The second connecting section 2122 is fixed to the bottom plate 110 by means of a press riveting connection. It may be appreciated that in some other embodiments, the means by which the second connecting section 2122 is fixed to the bottom plate 110 may be set according to actual requirements, such as screwing, snapping, welding, bonding, etc., and is not limited herein.

The first slideway portion 22 is connected with the connecting portion 212, and the first slideway portion 22 includes a first section 220 and a second section 222. The first section 220 is connected between the connecting portion 212 and the second section 222. The first section 220 extends from the second connecting section 2122 in a direction of the supporting portion 210, and the second section 222 extends from the first section 220 towards another side of the supporting portion 210 along the second direction Y. Preferably, the second section 222 is parallel to the bottom plate 110. The first section 220, the second section 222, and the bottom plate 110 together form the first slideway A1 which communicates with the first opening 101.

Along the second direction Y the second connecting section 2122 and the second section 222 are respectively arranged on two opposite sides of the first section 220, and the first connecting section 2120, the second connecting section 2122, and the first section 220 together form a receiving groove 240. The box body 100 further includes a fastener (not shown in figures) which is respectively connected to the second connecting section 2122 and the bottom plate 110 to fix the second connecting section 2122 to the bottom plate 110. The fastener is a press riveting nut, and the fastener is at least partially arranged in the receiving groove 240, In some other embodiments, the fastener may also be a fastening element, such as a screw, a fixing pin, etc.

The second slideway portion 23 is connected with the supporting portion 210, and the second slideway portion 23 includes a third section 230 and a fourth section 232. The third section 230 is connected between the supporting portion 210 and the fourth section 232. The third section 230 extends from the supporting portion 210 in a direction away from the bottom plate 110, and the fourth section 232 extends from the third section 230 towards another side of the supporting portion 210 along the second direction Y. Preferably, the fourth section 232 is parallel to the bottom plate 110. The third section 230, the fourth section 232, and the supporting portion 210 together form the second slideway A2 which communicates with the first opening 101.

In this embodiment, the number of the connecting portions 212 and the number of the first slideway portions 22 are two, respectively Two connecting portions 212 are respectively arranged on two opposite sides of the supporting portion 210 along the second direction Y. Each first slideway portion 22 is connected with a corresponding connecting portion 212. It may be understood that in some other embodiments, the number of the connecting portions 212 and the number of the first slideway portions 22 may also be one, respectively, as long as guiding for the tray assembly 30 can be realized.

In this embodiment, the number of the second slide portions 23 is two. Two second slideway portions 23 are respectively arranged on two opposite sides of the supporting portion along the second direction Y. It may be understood that in some other embodiments, the number of the second slideway portions 23 may also be one, as long as guiding for the tray assembly 30 can be realized.

Referring to FIGS. 7-9 together, the tray assembly 30 includes a first tray 31 and a second tray 32 which are respectively used for fixing the functional module 200. The firs tray 31 is movably disposed in the first slideway A1, and the first tray 31 is movable inside the first slideway A1 along the first direction X, so that the first tray 31 is limited relative to the support 20 in the second direction Y and the third direction Z. The second tray 32 is movably disposed in the second slideway A2, and the second tray 32 is movable inside the second slideway A2 along the first direction X, so that the second tray 32 is limited relative to the support 20 in the second direction Y and the third direction Z.

The first tray 31 includes a first tray portion 310, a first extending portion 312, and a first fixing portion 314. The first extending portion 312 and the first fixing portion 314 are respectively arranged on one side of the first tray portion 310 facing away from the bottom plate 110. The first tray portion 310 is used for fixing the functional module 200, the first extending portion 312 is arranged in cooperation with the first slideway portion 22, and the first fixing portion 314 is configured to be connected with the housing 10. The first extending portion 312 includes a first extending section 3120 and a second extending section 3122. The first extending section 3120 extends from one side of the first tray portion 310 in the direction facing away from the bottom plate 110, and the second extent section 3122 extends from the first extending section 3120 towards the other side of the first tray portion 310 along the second direction Y. The number of the first extending portions 312 is two. Two first extending portions 312 are respectively arranged on two sides of the first tray portion 310 along the second direction Y. The first fixing portion 314 is disposed on one side of the first tray portion 310 facing, away from the third side plate 122, and the first fixing portion 314 is connected with the first extending portion 312.

When the first tray 31 is disposed inside the first slideway A1, the first tray portion 310 is connected with the bottom plate 110 of the housing 10. The first extending section 3120 is arranged adjacent to the first section 220 of the first slideway portion 22 along the second direction Y, and the first section 220 limits the movement of the first extending section 3120 along the second direction Y. The second extending section 3122 is arranged adjacent to the second section 222 of the first slideway portion 22 along the third direction Z, and the second section 222 limits the movement of the second extending section 3122 along the third direction Z. In some embodiments, a gap is provided between the first section 220 and the first extending section 3120 to reduce the friction force between the first section 220 and the first extending section 3120, thereby facilitating the movement of the first tray 31. For example, a gap of 0.2 mm is provided between the first section 220 and the first extending section 3120 along the second direction Y. In some embodiments, a gap is provided between the second section 222 and the second extending section 3122 to reduce the friction force between the second section 222 and the second extending section 3122, thereby facilitating the movement of the first tray 31. For example, a gap of 0.1 mm is provided between the second section 222 and the second extending section 3122 along the third direction Z.

When the first tray 31 moves to a first position in a direction of the third side plate 122 along the first slideway A1, the first fixing portion 314 is connected with the first side plate 112, and the first tray 31 is disposed inside the housing 10. When the first tray 31 moves to a second position in a direction away from the third side plate 122, the functional module 200 on the first tray 31 is at least partially disposed outside the housing 10. In some embodiments, the first position and the second position may be determined as required, for example, at the second position, half of the first tray 31 may move out of the housing 10, or the first tray 31 may completely move out of the housing 10.

In some embodiments, the first extending section 3120 is connected in contact with the first section 220. In some embodiments, the second extending section 3122 is connected in contact with the second section 222. In some embodiments, a buffer may be provided between the first extending section 3120 and the first section 220, which facilitates the sliding of the first tray 31 and extends the service life of the first tray 31. In some embodiments, a buffer may be provided between the second extending section 3122 and the second section 222, which facilitates the sliding of the first tray 31 and extends the service life of the first tray 31.

The second tray 32 has a structure similar to that of the first tray 31. The second tray 32 includes a second tray portion 320, a second extending portion 322, and a second fixing portion 324. The second extending portion 322 and the second fixing portion 324 are respectively arranged on one side of the second tray portion 320 facing away from the bottom plate 110. The second tray portion 320 is used for fixing the functional module 200, the second extending portion 322 is arranged in cooperation with the second slideway portion 23, and the second fixing portion 324 is configured to be connected with the housing 10. The second extending portion 322 includes a third extending section 3220 and a fourth extending section 3222. The third extending section 3220 extends from one side of the second tray portion 320 in the direction facing away from the bottom plate 110, and the fourth extending section 3222 extends from the third extending section 3220 towards the other side of the second tray portion 310 along the second direction Y. The number of the second extending portions 322 is two. Two second extending portions 322 are respectively arranged on two sides of the second tray portion 320 along the second direction Y. The second fixing portion 324 is disposed on one side of the second tray portion 320 facing away from the third side plate 122, and the second fixing portion 324 is connected with the second extending portion 322.

When the second tray 32 is disposed inside the second slideway A2, the second tray portion 320 is connected with the main body portion 21 of the support 20. The third extending section 3220 is arranged adjacent to the third section 230 of the second slideway portion 23 along the second direction Y and the third section 230 limits the movement of the third extending section 3220 along the second direction Y. The fourth extending section 3222 is arranged adjacent to the fourth section 232 of the second slideway portion 23 along the third direction Z, and the fourth section 232 limits the movement of the fourth extending section 3222 along the third direction Z. In some embodiments, a gap is provided between the third section 230 and the third extending section 3220 to reduce the friction force between the third section 230 and the third extending section 3220, thereby facilitating the movement of the second tray 32. For example, a gap of 0.2 mm is provided between the third section 230 and the third extending section 3220 along the second direction Y. In some embodiments, a gap is provided between the fourth section 232 and the fourth extending section 3222 to reduce the friction force between the fourth section 232 and the fourth extending section 3222, thereby facilitating the movement of the second tray 32. For example, a gap of 0.1 mm is provided between the fourth section 232 and the fourth extending section 3222 along the third direction Z.

When the second tray 32 moves to the first position in the direction of the third side plate 122 along the second slideway A2, the second fixing portion 324 is connected with the first side plate 112, and the second tray 32 is disposed inside the housing 10. When the second tray 32 moves to the second position in the direction facing away from the third side plate 122, the functional module 200 on the second tray 32 is at least partially disposed outside the housing 10. In some embodiments, the first position and the second position may be determined as required, for example, at the second position, half of the second tray 32 may move out of the housing 10, or the second tray 32 may completely move out of the housing 10.

In some embodiments, the third extending section 3220 is connected in contact with the third section 230. In some embodiments, the fourth extending section 3222 is connected in contact with the fourth section 232. In some embodiments, a buffer may be provided between the third extending section 3220 and the third section 230, which facilitates the sliding of the second tray 32 and extends the service life of the second tray 32. In some embodiments, a buffer may be provided between the fourth extending section 3222 and the fourth section 232, which facilitates the sliding of the second tray 32 and extends the service life of the second tray 32.

In this embodiment, the first tray 31 or the second tray 32 may be fixed to the first side plate 112 of the housing 10 by means of press riveting when moving to the first position. It may be appreciated that in some other embodiments, the first tray 31 and the second tray 32 may be respectively fixed to the housing 10 in other ways, such as, snapping, screwing, bonding, etc., which are not limited herein.

Referring to FIGS. 9-10 together, in some embodiments, the housing 10 further includes a third slideway portion 13 provided with a third slideway A3. The tray assembly 30 further includes a third tray 33 which is disposed in the third slideway A3 and is movable inside the third slideway A3 along the first direction X.

Specifically, the third slideway portion 13 includes a fifth section 130, a sixth section 132, and a seventh section 134. The sixth section 132 and the seventh section 134 are respectively arranged on the fifth section 130, and the fifth section 130, the sixth section 132, and the seventh section 134 together form the third slideway A3. The fifth section 130 extends from the first side plate 112 in the direction of the third side plate 122, the sixth section 132 is disposed on one side of the fifth section 130 facing the bottom plate 110, the seventh section 134 is disposed on one side of alae fifth section 130 facing away from the bottom plate 110, and the sixth section 132 and the seventh section 134 are respectively arranged parallel to the bottom plate 110. The number of the third slideway portions 13 is two. Two third slideway portions 13 are respectively arrange on two sides of the first opening 101 along the second direction Y.

The third tray 33 has a structure similar to those of the first tray 31 and the second tray 32, which will not be repeated herein. Accordingly, the third tray 33 includes a third tray portion, a third extending portion, and a third fixing portion. The third extending portion includes a fifth extending section and a sixth extending section. The fifth extending section extends from one side of the third tray portion in the direction facing away from the bottom plate 110, and the sixth extending section extends from the fifth extending section towards the other side of the third tray portion along the second direction Y. The third tray portion is used for fixing the functional module 200, the third extending portion is arranged in cooperation with the third slideway portion 13, and the third fixing portion is configured to be connected with the housing 10.

When the third tray 33 is disposed inside the third slideway A3, the third tray portion is connected with the sixth section 132 of the third slideway portion 13. The fifth extending section is arranged adjacent to the fifth section 130 of the third slideway portion 13 along the second direction Y, and the fifth section 130 limits the movement of the fifth extending section along the second direction Y. The sixth extending section is arranged adjacent to the seventh section 134 of the third slideway portion 13 along the third direction Z, and the seventh section 134 limits the movement of the sixth extending section along the third direction Z. In some embodiments, a gap is provided between the fifth section 130 and the fifth extending section to reduce the friction force between the fifth section 130 and the fifth extending section, thereby facilitating the movement of the third tray 33. For example, a gap of 0.2 mm is provided between the fifth section 130 and the fifth extending section along the second direction Y. In some embodiments, a gap is provided between the seventh section 134 and the sixth extending section to reduce the friction force between the seventh section 134 and the sixth extending section, thereby facilitating the movement of the third hay 33, For example, a gap of 0.1 mm is provided between the seventh section 134 and the sixth extending section along the third direction Z.

When the third tray 33 moves to the first position in the direction of the third side plate 122 along the third slideway, the third fixing portion of the third tray 33 is connected with the first side plate 112, and the third tray 33 is disposed inside the housing 10. When the third tray 33 moves to the second position in the direction facing away from the third side plate 122, the functional module 200 on the third tray 33 is at least partially disposed outside the housing 10. In some embodiments, the first position and the second position may be determined as required, for example, at the second position, half of the third tray 33 may move out of the housing 10, or the third tray 33 may completely move out of the housing 10.

In some embodiments, the fifth extending section is connected in contact with the fifth section 130. In some embodiments, the sixth extending section is connected in contact with the seventh section 134. In some embodiments, a buffer may be provided between the fifth extending section and the fifth section 130, which facilitates the sliding of the third tray 33 and extends the service life of the third tray 33. In some embodiments, a buffer may be provided between the sixth extending section and the seventh section 134, which facilitates the sliding of the third tray 33 and extends the service life of the third tray 33.

Referring to FIGS. 11-13 together, the functional module 200 includes a first circuit board, a second circuit board, and a third circuit board. In some embodiments, the first circuit board includes a management system main board 201, the second circuit board includes a power supply main board 202, and the third circuit board includes an insulation detection main board 203. The management system main board 201 is mounted in the first tray 31 which may drive the management system main body 201 to move relative to the housing 10. The power supply main board 202 is mounted in the second tray 32 which may drive the power supply main board 202 to move relative to the housing 10, The insulation detection main board 203 is mounted in the third tray 33 which may drive the power supply main board 202 to move relative to the housing 10. The power supply main board 202 may be connected with the third tray 33 to support the third tray 33 which is movable along one side of the power supply main board 202 facing away from the second tray 32. In some other embodiments, different functional modules may be disposed in different trays.

In some embodiments, the high-voltage box apparatus 300 further includes a fourth circuit board 41 which is disposed inside the housing 10 and connected with the support 20. A fixing portion 24 is further provided on one side of the support 20 facing away from the first side plate 112. The fourth circuit board 41 may be fixed to the fixing portion 24 by means of press riveting. The fourth circuit board 41 is electrically connected with the functional module 200. The fourth circuit board 41 is an adapter plate. In some other embodiments, the fourth circuit board 41 may be other functional modules.

Further, the fourth circuit board 41 is provided with a fourth connecting member 410. In some embodiments, the first circuit board is provided with a first connecting member 2010 which is in plug-in connection with the fourth connecting member 410 to realize the connection between the first circuit board and the fourth circuit board. In some embodiments, the second circuit board is provided with a second connecting member 2020 which is in plug-in connection with the fourth connecting member 410 to realize the connection between the second circuit board and the fourth circuit board. In some embodiments, the third circuit board 203 is further provided with a third connecting member (not shown in figures) which is in plug-in connection with the fourth connecting member 410 to realize the connection between the third circuit board and the fourth circuit board. It should be noted that the plug-in connection between the first connecting member 2010 and the fourth connecting member 410 may be a direct plug-in connection or a connection via an adapter harness, the plug-in connection between the second connecting member 2020 and the fourth connecting member 410 may be a direct plug-in connection or a connection via an adapted harness, and the plug-in connection between the third connecting member and the fourth connecting member 410 may be a direct plug-in connection or a connection via an adapted harness.

In some embodiments, the high-voltage box apparatus 300 further includes a safety apparatus 42 disposed inside the housing 10 and mounted on the support 20. The safety apparatus 42 is fixed to the supporting portion 210 of the main body portion 21 by means of press riveting, and disposed on one side of the second tray 32 along the second direction Y. The safety apparatus 42 is connected with the fourth circuit board 41 via a harness, and is configured to turn off a circuit device in time when the circuit device works abnormally.

In some embodiments, the high-voltage box apparatus 300 further includes an air switch 43 which is disposed inside the housing 10, mounted on the bottom plate 110, and arranged on one side of the support 20. The air switch 43 is connected with the first side plate 112 which is provided with a second opening 102 thereon, and an operating handle of the air switch 43 is disposed at the second opening 102, so that the air switch 43 may be operated outside the housing 10. The air switch 43 is respectively electrically connected with the fourth circuit board 41 and the safety apparatus 42 via a harness, and is configured to control the turning on or off of the circuit device.

Another embodiment of this application further provides an energy storage device, including the high-voltage box apparatus 300 of any one of the above embodiments. The high-voltage box apparatus 300 is configured to manage high-voltage power distribution of the energy storage device, provide charging and discharging control, high-voltage component power-on control, circuit overload and short circuit protection, high-voltage sampling, low-voltage control, and other functions for a high-voltage system, and protect and monitor the operation of the high-voltage system.

Another embodiment of this application further provides electric equipment, comprising the high-voltage box apparatus 300 of in one of the above embodiments. The high-voltage box apparatus 300 is configured to control and distribute the energy of the energy storage device in the electric equipment. The electric equipment may be equipment using an energy storage device, such as vehicles, ships, aircrafts, energy storage devices, low handheld power tools, etc.

It should be noted that preferred some embodiments of this application are given in the specification of this application and the attached drawings thereof, however, this application may be implemented in many different forms and is not limited to some embodiments described herein. These embodiments are not intended as additional limitations on the disclosure of this application, and are provided for the purpose of providing a more thorough and comprehensive understanding of the disclosure of this application. Moreover, the technical features described above continue to be combined with each other to form various some embodiments not listed above, which are all considered to be within the scope recorded in the specification of this application. Further, for one of ordinary skill in the art, improvements or variations may be made in accordance with the above description, and all such improvements and variations shall belong to the scope of protection of the appended claims of this application.

The invention claimed is:

1. A box body, comprising:
a housing provided with a first opening;
a support disposed inside the housing;
a tray assembly movably disposed on the support, the tray assembly is configured to be at least partially movable out of the housing through the first opening, wherein the tray assembly is configured for fixing a functional module,
wherein the support is provided with at least one slideway, the tray assembly is disposed inside the at least one slideway, and the tray assembly is movable relative to the support along the at least one slideway;
wherein the at least one slideway comprises a first slideway and a second slideway; the first slideway and the second slideway are respectively arranged on two opposite sides of the support;
the tray assembly comprises a first tray and a second tray; the first tray is disposed in the first slideway, and the second tray is disposed in the second slideway;
wherein the first slideway is arranged along a first direction, and the first tray is movable in the first slideway along the first direction, the first tray is limited relative to the support in a second and a third direction, and/or the second slideway is arranged along the first direction, and the second tray is movable in the second slideway along the first direction, the second tray is limited relative to the support in the second direction and the third direction;
wherein the first direction, the second direction, and the third direction are perpendicular to each other;
wherein the housing comprises a bottom plate, the support is disposed on the bottom plate;

the support comprises a main body portion, a first slide-way portion, and a second slideway portion; the first slideway portion is disposed on a first side of the main body portion, the first side of the main body portion being a side facing the bottom plate, the first slideway portion and the bottom plate form the first slideway; and the second slideway portion is disposed on a second side of the main body portion, the second side of the main body portion being a side facing away from the bottom plate, the second slideway portion and the main body portion form the second slideway.

2. The box body according to claim 1, wherein the housing further comprises a first side plate disposed on one side of the bottom plate along the first direction the first opening runs through the first side plate;

the first tray is connected with the first side plate, and/or the second tray is connected with the first side plate.

3. The box body according to claim 1, wherein the first tray comprises a first tray portion and a first extending portion; the first tray portion is connected to the first extending portion;

the first tray portion is configured for fixing the functional module, and the first extending portion is configured to be connected with the first slideway portion.

4. The box body according to claim 3, wherein the first slideway portion comprises a first section and a second section; the first section extends from the main body portion in a direction away from the bottom plate, and the second section extends from the first section along the second direction;

the first extending portion comprises a first extending section and a second extending section;

the first extending section extends from the first tray portion in the direction away from the bottom plate, and the second extending section extends from the first extending section along the second direction;

the first section is configured to limit the movement of the first extending section along the second direction, and the second section is configured to limit the movement of the second extending section along the third direction.

5. The box body according to claim 1, wherein the main body portion comprises a supporting portion and a connecting portion; the connecting portion is disposed on a side of the supporting portion, the side of the supporting portion being a side facing the bottom plate;

the second slideway portion is connected to connecting portion.

6. The box body according to claim 5, wherein the second slideway portion comprises a third section and a fourth section; the third section extends from the supporting portion in a direction away from the bottom plate, and the fourth section extends from the third section towards another side of the supporting portion along the second direction;

the third section, the fourth section, and the supporting portion together form the second slideway, the second slideway communicates with the first opening.

7. The box body according to claim 5, wherein the connecting portion comprises a first connecting section and a second connecting section; the first connecting section is connected between the supporting portion and the second connecting section;

the first connecting section extends from a side of the supporting portion, the side of the supporting portion being a side towards the bottom plate;

the second connecting section extends from the first connecting section along the second direction.

8. The box body according to claim 6, wherein along the second direction, the second connecting section and the second section are respectively arranged on two opposite sides of the first section;

the first connecting section, the second connecting section, and the first section together form a receiving groove;

the box body further comprises a fastener, the fastener fixes the second connecting section to the bottom plate, the fastener is at least partially arranged in the receiving groove.

9. The box body according to claim 2, wherein the housing further comprises a third slideway portion provided with a third slideway, the third slideway portion is connected to the first side plate;

the tray assembly further comprises a third tray; the first tray, the second tray and the third tray are set in sequence in the third direction; the third tray is disposed in the third slideway and is movable inside the third slideway along the first direction.

10. The box body according to claim 4, wherein the at least one slideway portion comprises two first slideway portion, the second section of the two first slideway portions are disposed facing towards to each other.

11. The box body according to claim 4, wherein a gap is provided between the first section and the first extending section along the second direction.

12. The box body according to claim 4, wherein a gap is provided between the second section and the second extending section along the third direction.

13. A high-voltage box apparatus, comprising:
a functional module; and
the box body of claim 1, wherein the functional module is installed on the tray assembly.

14. The high-voltage box apparatus according to claim 13, wherein the functional module comprises at least one of a management system main board, a power supply main board, or an insulation detection board.

15. The high-voltage box apparatus according to claim 13, wherein the functional module includes a first circuit board, the first circuit board is provided with a first connecting member;

the high-voltage box apparatus further comprising a fourth circuit board, the fourth circuit board is disposed on a side of the support, the side of the support being a side facing away from the first opening;

the fourth circuit board is provided with a fourth connecting member, the first connecting member is in a plug-in connection with the fourth connecting member.

16. An energy storage device, comprising the high-voltage box apparatus of claim 13.

* * * * *